US005258662A

United States Patent [19]

Skovmand

[11] Patent Number: 5,258,662

[45] Date of Patent: Nov. 2, 1993

[54] MICROPOWER GATE CHARGE PUMP FOR POWER MOSFETS

[75] Inventor: Timothy J. Skovmand, San Jose, Calif.

[73] Assignee: Linear Technology Corp., Milpitas, Calif.

[21] Appl. No.: 862,993

[22] Filed: Apr. 6, 1992

[51] Int. Cl.[5] ...................... H03L 5/00; H03K 17/687

[52] U.S. Cl. ................................ 307/296.3; 307/571; 307/573; 307/246; 323/349

[58] Field of Search ............ 307/246, 571, 573, 296.3, 307/304, 264, 270; 323/349, 351

[56] References Cited

U.S. PATENT DOCUMENTS

| | | | |
|---|---|---|---|
| 3,942,047 | 3/1976 | Buchanan | 307/297 |
| 4,061,929 | 12/1977 | Asano | 307/246 |
| 4,106,086 | 8/1978 | Holbrook et al. | 363/60 |
| 4,149,232 | 4/1979 | Eaton, Jr. | 363/60 |
| 4,199,806 | 4/1980 | Patterson, III | 363/60 |
| 4,305,009 | 12/1981 | Miyagawa et al. | 307/264 |
| 4,482,825 | 11/1984 | Nozaki | 307/578 |
| 4,485,433 | 11/1984 | Topich | 363/60 |
| 4,603,269 | 7/1986 | Hochstein | 307/571 |
| 4,612,462 | 9/1986 | Asano et al. | 307/482 |
| 4,616,303 | 10/1986 | Mauthe | 363/60 |
| 4,636,930 | 1/1987 | Bingham et al. | 363/60 |
| 4,679,134 | 7/1987 | Bingham et al. | 363/61 |
| 4,777,577 | 10/1988 | Bingham et al. | 363/60 |
| 4,797,899 | 1/1989 | Fuller et al. | 375/7 |
| 4,809,152 | 2/1989 | Bingham et al. | 363/61 |
| 4,812,961 | 3/1989 | Essaff et al. | 363/61 |
| 4,847,522 | 7/1989 | Fuller et al. | 307/446 |
| 4,897,774 | 1/1990 | Bingham et al. | 363/61 |
| 4,914,546 | 4/1990 | Alter | 361/313 |
| 4,951,101 | 8/1990 | Alter et al. | 357/234 |
| 4,992,683 | 2/1991 | Robin, Jr. | 307/571 |
| 4,999,761 | 3/1991 | Bingham et al. | 363/60 |
| 5,006,736 | 4/1991 | Davies | 307/573 |
| 5,023,474 | 6/1991 | Wilcox | 307/571 |
| 5,034,875 | 7/1991 | Hattori | 307/571 |
| 5,051,613 | 9/1991 | Houser, Jr. et al. | 307/296.3 |
| 5,177,429 | 1/1993 | Eki | 323/349 |

OTHER PUBLICATIONS

"Maxim, Quad, High-Side MOSFET Drivers Max620-/Max621", data sheet published by Maxim Integrated Products, Sunnyvale, California, Jul. 1991, pp. 1-12.

"Micrel MIC5012 Dual Power MOSFET Predriver," *1991 Micrel Semiconductor Databook*, Sunnyvale, California, 1991, pp. 2-91 to 2-99.

*Primary Examiner*—John S. Heyman
*Assistant Examiner*—My Trang
*Attorney, Agent, or Firm*—Laurence S. Rogers; Robert W. Morris

[57] ABSTRACT

A power efficient circuit for charging the gate of a transistor switch to a charge-pumped voltage level in excess of a supply rail voltage is provided. The circuit includes a current-controlled oscillator which generates an oscillating waveform that drives a capacitive charge-pump circuit. The circuit monitors the gate voltage of the transistor switch and reduces the frequency of the oscillating waveform, thereby reducing power consumption, when the gate voltage exceeds a frequency switching value indicating that the transistor switch has been sufficiently turned so as to allow the circuit to enter a micropower mode.

16 Claims, 7 Drawing Sheets

MICROPOWER GATE CHARGE PUMP FOR POWER MOSFETS

BACKGROUND OF THE INVENTION

This invention relates to a micropower charge pump circuit for driving the gate of a field effect transistor.

Charge pump circuits are used to drive the gates of field effect transistors to voltage levels in excess of supply rail voltages. Typically, such circuits have been used to drive MOSFET transistors that switch power to electronic loads. For example, in portable computer applications, MOSFET power transistors are used to switch peripheral devices such as disk drives and displays. In such and other applications, the peripheral device is coupled to the source of the MOSFET switch while the MOSFET's drain is coupled to the supply rail. When a MOSFET switch is coupled in this way (as a so-called "high side" driver), it is desirable to drive the gate of the switch at voltages in excess of the supply rail voltage in order to fully turn on and enhance the switch.

Charge pump circuits used to drive MOSFET switches typically employ oscillators in conjunction with a small number of capacitors to multiply or boost the supply rail voltage to a higher gate voltage. In many applications, the power consumed by this type of circuit is usually dwarfed by the power consumed by the load or the MOSFET switch itself. For example, the operating current of a charge pump circuit might be in the range of a few milliamperes while the switched load current might be on the order of amperes. Thus, the power efficiency of the charge pump circuit itself is generally of minimal concern.

However, there are some battery-powered applications (such as lap-top computer applications) where the power efficiency of the charge pump circuit can become important. In these applications, the power efficiency of the charge pump circuit may be a significant factor in determining battery drain and, hence, battery life before recharging or replacement of the battery becomes necessary.

In view of the foregoing, it would therefore be desirable to provide a power efficient charge pump circuit which can rapidly multiply or boost a supply rail voltage so as to drive the gate of a MOSFET or other switch at a voltage in excess of the supply rail voltage.

SUMMARY OF THE INVENTION

It is an object of this invention to provide a power efficient charge pump circuit which can rapidly multiply or boost a supply rail voltage so as to drive the gate of a MOSFET or other switch at a voltage in excess of the supply rail voltage.

In accordance with the present invention, a power efficient circuit and method are provided for charging the gate of a field-effect transistor (FET) such as a MOSFET to a voltage boosted in excess of a supply voltage. The circuit and method use a capacitive voltage multiplier circuit, driven by a variable frequency oscillator, to produce a gate voltage boosted in excess of a supply voltage. When the FET is first turned on (by application of a gate voltage), the oscillator drives the multiplier at a first frequency chosen to cause the gate voltage of the transistor to be boosted at a first rapid rate beyond the supply voltage. The state of the FET is monitored (such as by monitoring the transistor's gate voltage) and, when that state or gate voltage reaches a frequency switching state or voltage, the frequency of oscillation of the oscillator is responsively reduced to a second frequency lower than the first frequency. The second frequency is chosen to be sufficient to continue to boost the gate voltage at a lower rate to sustain the gate voltage in excess of the supply voltage. The reduction in the frequency of oscillation significantly reduces the power consumption of the circuit while the FET is being driven.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DETAILED DESCRIPTION OF THE INVENTION

Figure 1:
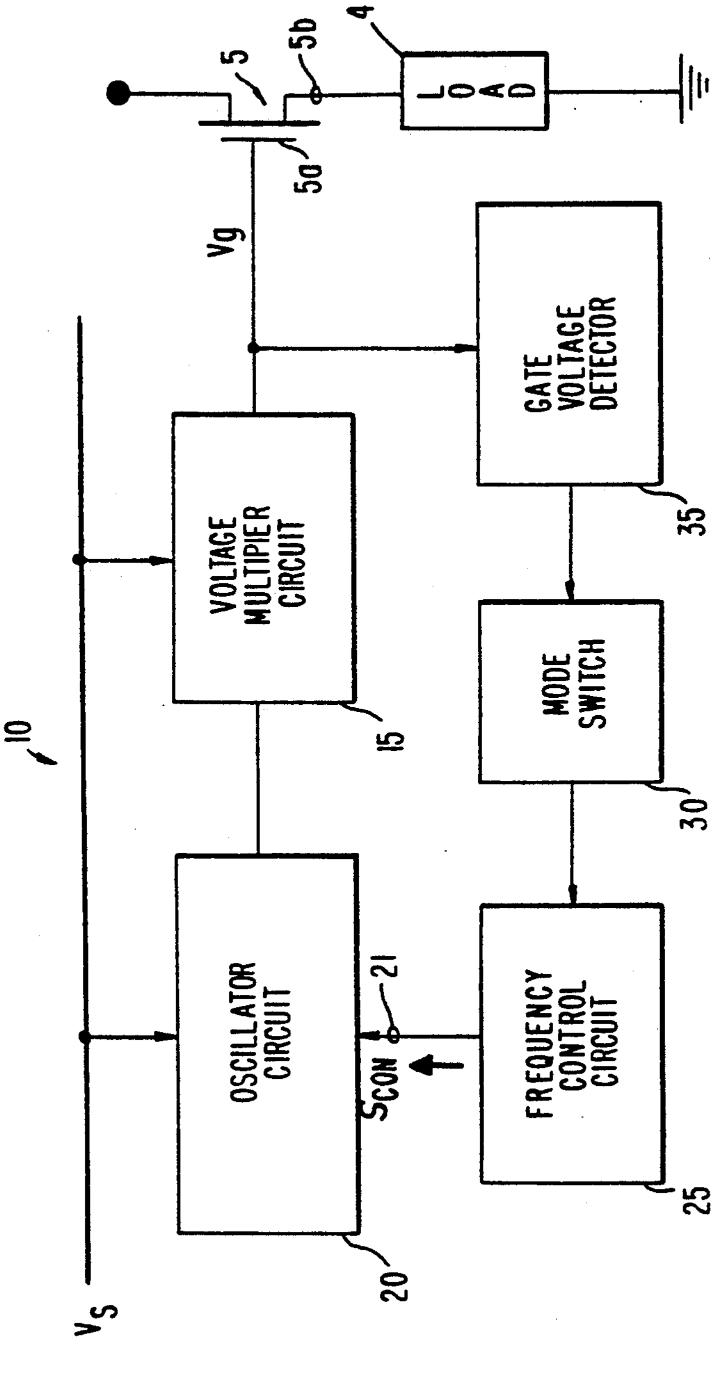
FIG. 1 is a block diagram of the charge pump circuit of the present invention.

FIG. 1 is a block diagram of the charge pump circuit 10 of the present invention.

As shown in FIG. 1, charge pump circuit 10 drives gate *5a* of MOSFET 5, which is used as a high-side switch to supply power to a load 4 connected to source *5b* of MOSFET 5. In a typical lap-top computer application, for example, MOSFET 5 could be a switch for supplying power to a disk drive or a fluorescent lamp circuit for illuminating a display.

Charge pump circuit 10 includes voltage multiplier circuit 15 which controls the application of a voltage to the gate of MOSFET 5 to turn the transistor ON and OFF. MOSFET 5 is in its OFF state when the gate voltage exceeds the transistor's gate threshold voltage. Although a gate voltage greater than the threshold voltage is sufficient to turn the MOSFET ON, it is desirable in turning on the transistor to apply a gate voltage in excess of the supply rail voltage $V_S$. Applying such a high gate voltage causes MOSFET 5 to be turned on harder, where it operates more efficiently and can supply a greater current than would otherwise be possible. The present invention, as described further below, allows such gate voltages to be generated efficiently so that the charge pump circuit can be operated under micropower conditions.

Voltage multiplier circuit 15 in FIG. 1 is driven by oscillator 20. Oscillator 20 generates an oscillating waveform to cause multiplier circuit 15 to produce a voltage, $V_G$, which exceeds the supply voltage $V_S$. The output frequency of oscillator 20 is, in turn, controlled by frequency control circuit 25 which, via terminal 21, supplies a frequency control signal $S_{CON}$ to oscillator 20. For the circuit embodiment shown in FIG. 1, control signal $S_{CON}$ is generated by the combination of frequency control circuit 25, mode switch 30 and gate voltage detector circuit 35.

The state or value of control signal $S_{CON}$—and, hence, the frequency of oscillation of oscillator 20—is determined by the state of mode switch 30. When mode switch 30 is in a first state, control signal $S_{CON}$ assumes a first value $S_{CON1}$. When mode switch 30 is in a second state, control signal $S_{CON}$ assumes a second value $S_{CON2}$. The state of mode switch 30 is determined, in turn, by gate voltage detector circuit 35 which monitors the operational state of MOSFET 5 as further described below.

The circuit of FIG. 1 operates as follows. When circuit 10 is first turned on, the gate voltage of MOSFET 5 is initially low. This is detected by gate voltage detector 35, which causes frequency control circuit 25 to generate control signal $S_{CON1}$ to, in turn, cause oscillator 20 initially to operate at a first high frequency f1. Frequency f1 is a very high frequency (e.g., 400–600 kHz) chosen to cause voltage multiplier circuit 15 initially to rapidly boost the gate voltage of the MOSFET beyond the supply voltage at a first rate. This rapidly boosted gate voltage causes MOSFET 5 to turn on quickly.

Because of the high frequency f1 at which oscillator 20 initially operates to produce a rapidly boosted gate voltage $V_G$, voltage multiplier circuit 15 and oscillator 20 draw relatively large amounts of power. To reduce this power consumption in accordance with the present invention, gate voltage detector circuit 35, mode switch 30 and frequency control circuit 25 operate to switch the frequency of operation of oscillator 20 to a second frequency f2 when the gate voltage $V_G$ reaches a frequency switching voltage ("$V_{FSW}$"). $V_{FSW}$ is chosen to be high enough to ensure that MOSFET 5 has been driven sufficiently hard and fast enough into enhancement. When gate voltage $V_S$ reaches $V_{FSW}$, gate voltage detector 10 generates a signal to cause mode switch 30 to switch states. Mode switch 30, in turn, causes frequency control circuit 25 to generate the second control signal $S_{CON2}$ to cause oscillator 20 to oscillate at frequency f2. Frequency f2 chosen to be lower than frequency fl (e.g., 100–200 kHZ), but still sufficient to produce a gate voltage $V_G$ boosted beyond $V_S$.

The frequency at which oscillator 20 oscillates can be controlled using either a voltage or a current signal, or substantially any other type of control signal which is capable of modifying the operating frequency of oscillator 20. Thus, oscillator 20 can be a current-controlled oscillator or voltage-controlled oscillator, or some other type of oscillator capable of supplying a plurality of frequencies to voltage multiplier circuit 15.

Figure 2A:
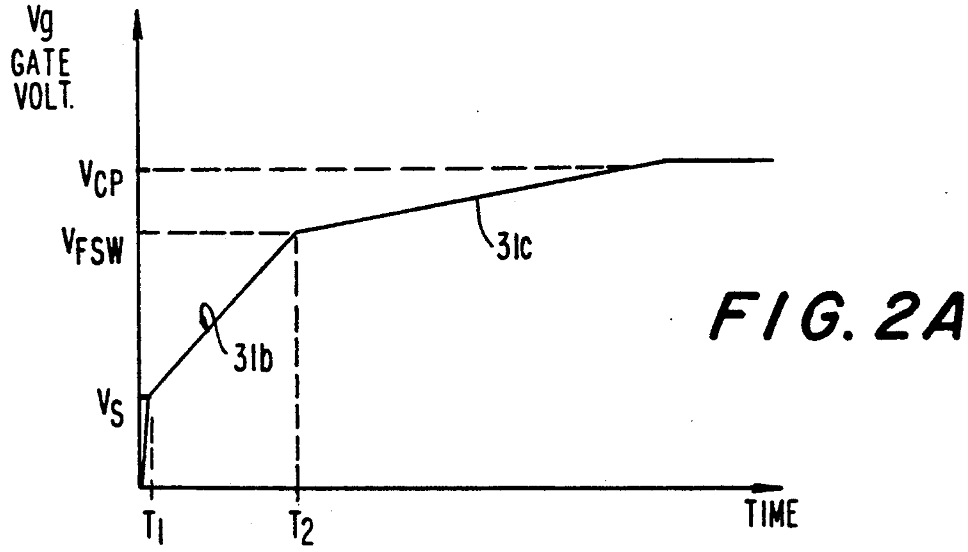
FIGS. 2A-C respectively show illustrative plots of gate voltage, oscillator frequency and current consumption, all versus time, for the charge pump circuit of FIG. 1.
Figure 2B:
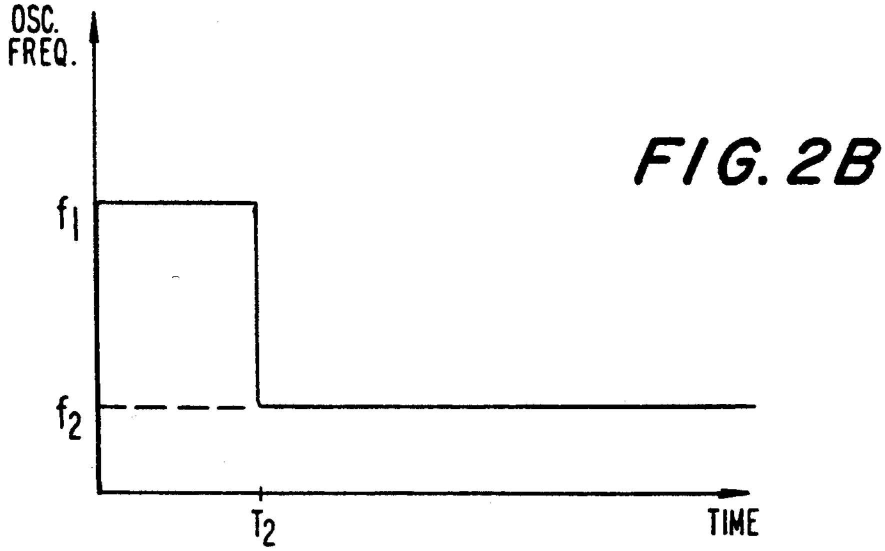
Figure 2C:
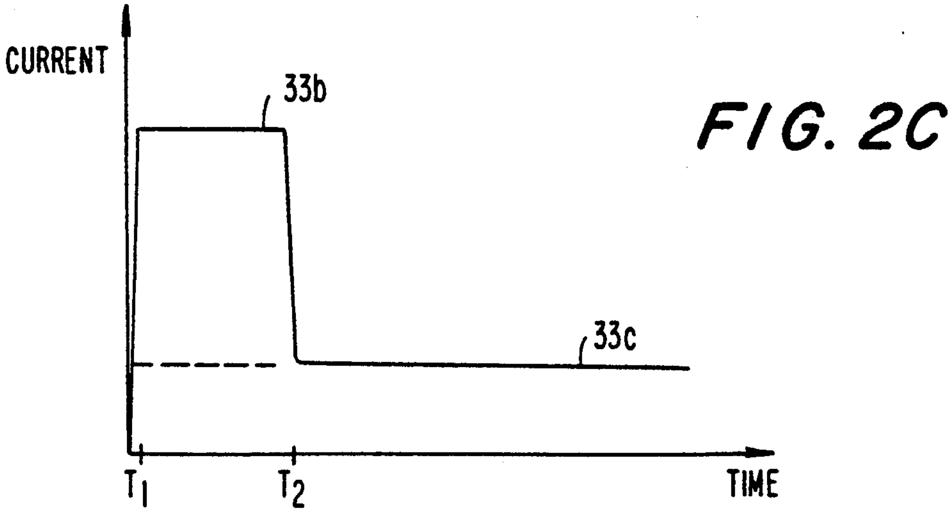

FIGS. 2A–2C show illustrative plots of gate voltage $V_G$ at gate 5*a* (FIG. 2A), oscillation frequency f of oscillator 20 (FIG. 2B) and charge-pump current consumption (FIG. 2C), all versus time, for circuit 10 of FIG. 1.

As shown in FIG. 2A, gate voltage $V_G$ of circuit 10 reaches the supply rail voltage $V_S$ at time $T_1$ (typically a few microseconds after circuit 10 is first turned on), and then rapidly increases beyond this voltage between times $T_1$ and $T_2$ (region 31*b*) at a rate determined at least in part by the oscillation frequency of oscillator 20 (shown, in FIG. 2B, as frequency f1 prior to time $T_2$).

When the gate voltage Vs reaches the frequency switching voltage $V_{FSW}$ at time $T_2$ (see FIG. 2A), gate voltage detector circuit 35 senses this and sends a signal to mode switch 30 indicating that the frequency of oscillator 20 should be reduced to a value f2. This switching of oscillator 20 to frequency f2 is shown in FIG. 2B as occurring at time $T_2$. The effect of this decrease in frequency of oscillation is shown in FIGS. 2A and 2C. FIG. 2A shows that the decrease in the frequency of oscillation at time $T_2$ causes gate voltage $V_G$ to continue to ramp up, but now at a reduced rate (see region 31*c*). However, current (and, hence, power) consumption has been substantially reduced as shown in FIG. 2C (see region 33*c*). The gate voltage $V_G$ is close enough, however, to its final charge-pumped value ($V_{CP}$) so as to still be beneficial in driving MOSFET 5 hard into enhancement.

An additional feature of the present invention is that charge pump circuit 10 is able to drive a wide variety of MOSFET switches without the need for modifying or altering the charge pump circuit components. This feature of the present invention is attributable to circuit 35, which monitors the gate voltage on the MOSFET switch. Gate voltage detector circuit 35 ensures that the proper gate voltage, independent of the particular characteristics of the MOSFET switch, is achieved before the oscillator drive frequency is reduced to conserve power. This gate voltage level is built into the charge pump circuit so that interchanging MOSFET power switches would not necessarily require modifications or alterations to the charge pump circuit components.

Although FIG. 1 shows mode switch 30 as being controlled by a gate voltage detector circuit 35, it will be appreciated by persons skilled in the art that other circuitry may be used to provide this control. For example, mode switch 30 can be controlled by substantially any other type of circuit (of conventional construction) which is able to monitor the operational state of MOSFET 5 and to send a signal to mode switch 30 indicating that the operating frequency of oscillator 20 can be reduced. As used herein, the term "operational state" is defined to mean a particular set of current-voltage parameters of MOSFET 5 (e.g., gate voltages in excess of the frequency switching value, source-drain voltages or source-drain currents in excess of a frequency swithcing value, or any combination thereof). Thus, rather than or in addition to detecting the gate voltage of MOSFET 5, a detector circuit could alternatively be coupled to sense the voltage at the source or drain terminals, or between those terminals, of MOSFET 5. Or, a detector circuit could be used that senses the current conducted by MOSFET 5 (such as a conventional resistor or other impedance in series with the MOSFET and its load to generate a current sense voltage). As yet another alternative, a detector circuit could be connected to sense the voltage or current across a load coupled to MOSFET 5.

Moreover, although FIG. 1 shows three discrete "blocks" for frequency control circuit 25, mode switch 30 and gate voltage detector 35, these three functions can as well be combined or condensed into a single block or circuit which monitors the operational state of MOSFET switch 5 and responsively controls the oscillation frequency of oscillator 20.

Additionally, although FIG. 1 shows an application where charge pump circuit 10 is used as a high-side MOSFET driver, persons skilled in the art will recognize other applications for use of the charge pump circuit of the present invention. For example, charge pump circuit 10 could be used as a low-side MOSFET driver (i.e., where the MOSFET is connected to the low side of a load). Persons skilled in the art will also recognize that, although FIG. 1 shows a voltage multiplier circuit which multiplies or boosts the supply rail voltage to a higher voltage, charge pump circuit 10 could also be used, with appropriate modification of voltage multiplier circuit 15, as a power efficient circuit for providing inverted or divided voltages.

Figure 3:
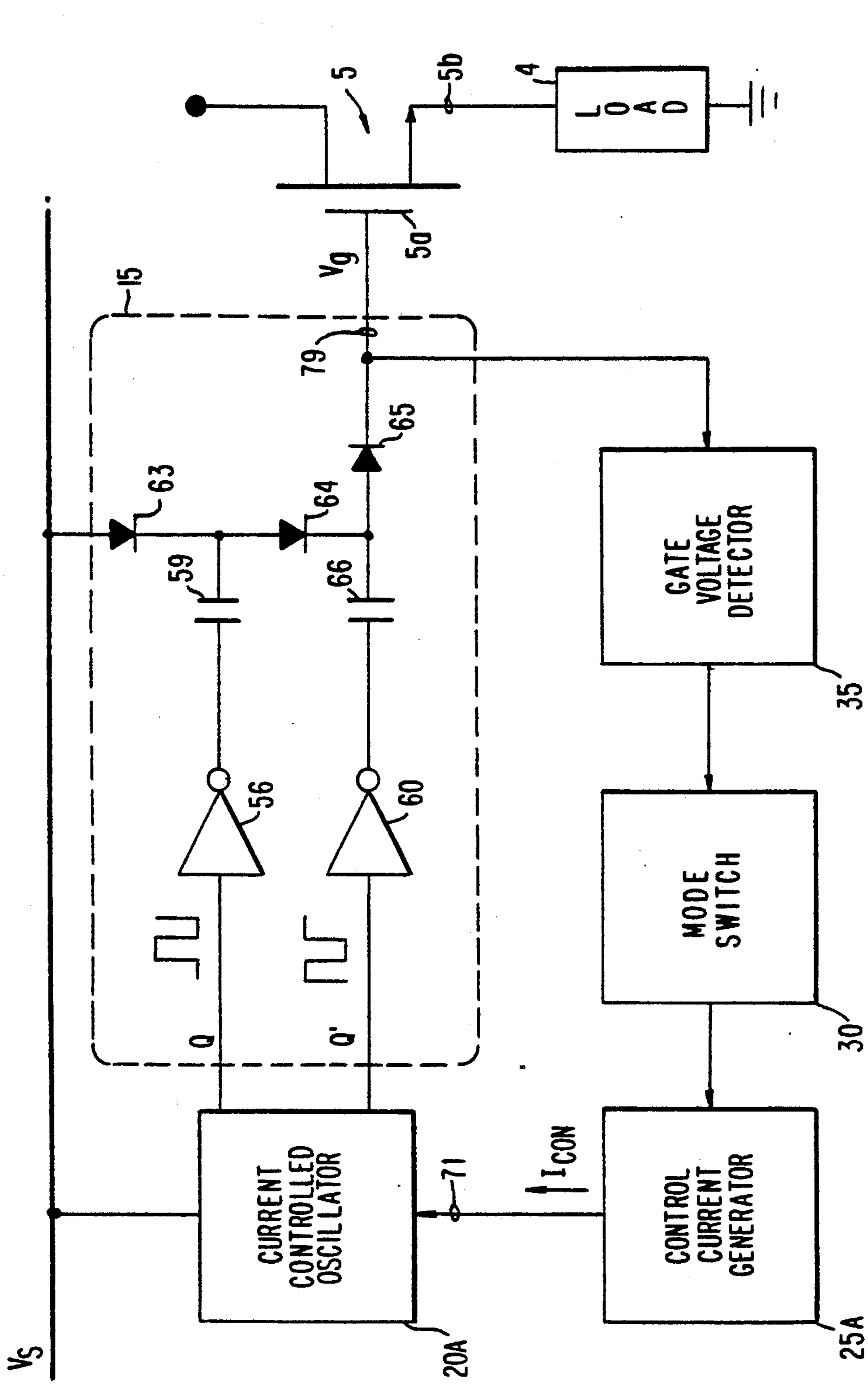
FIG. 3 is a block and circuit diagram of an exemplary embodiment of the charge pump circuit of the present invention.

FIG. 3 is a more detailed block and circuit diagram of an exemplary embodiment of the charge pump circuit of the present invention shown in FIG. 1.

As shown in FIG. 3, the charge pump circuit includes, as discussed with respect to FIG. 1, voltage multiplier circuit 15, mode switch 30 and gate voltage detector circuit 35. In FIG. 3, oscillator 20A is a current-controlled oscillator which is controlled by a current signal $I_{CON}$ that is generated by control current generator 25A. The charge pump circuit of FIG. 3 drives gate 5*a* of MOSFET 5, which has its source 5*b* connected to the high-side of load 4 as in FIG. 1.

Voltage multiplier circuit 15 of FIG. 3 is an oscillator-driven capacitive multiplier circuit. Voltage multiplier circuit 15 includes inverters 56 and 60 which are driven out of phase (Q and Q') by current-controlled oscillator 20A. The oscillator frequency of oscillator 20A is controlled by the magnitude of a current signal $I_{CON}$ as the control signal $S_{CON}$ in FIG. 1 The output of inverters 56 and 60 are, respectively, coupled to and drive charge-pump capacitors 59 and 66. These capacitors are connected to diodes 63, 64 and 65, as shown, to generate at the cathode of diode 65 a voltage, $V_G$, which is greater than supply voltage $V_S$. This voltage boosting or multiplying is obtained as follows.

During the LOW and HIGH cycling of inverter 56, the voltage at node A (at the output of inverter 56 connected to capacitor 59) cycles between zero (LOW) and close to (a diode drop away from) $V_S$ (HIGH), respectively. On the other hand, the other side of capacitor 59 (at node B) cycles between a voltage close to $V_S$ and a boosted voltage of about $2V_S$, respectively, because diode 63 turns OFF when the output of inverter 56 goes HIGH. Similarly, during the LOW and HIGH cycling of invertor 60 (which, as discussed, is out of phase with the cycling of invertor 56), the voltage at the output of invertor 60 (at node C) cycles between zero and $V_S$, respectively. On the other hand, the voltage at the cathode of diode 64 (node D) cycles between approximately $2V_S$ and $3V_S$ (ignoring diode drops) because capacitor 59, as discussed above, produces a boosted-voltage of about $2V_S$. Thus, the voltage $V_G$ at gate 5*a* of voltage multiplier circuit 15 reaches a boosted level of about $3V_S$. As long as the leakage currents in voltage multiplier circuit 15 are insignificant in comparison to the amount of charge involved, then the voltage $V_G$ on gate 5*a* can be charged and sustained at a level of approximately $3V_S$.

Figure 4:
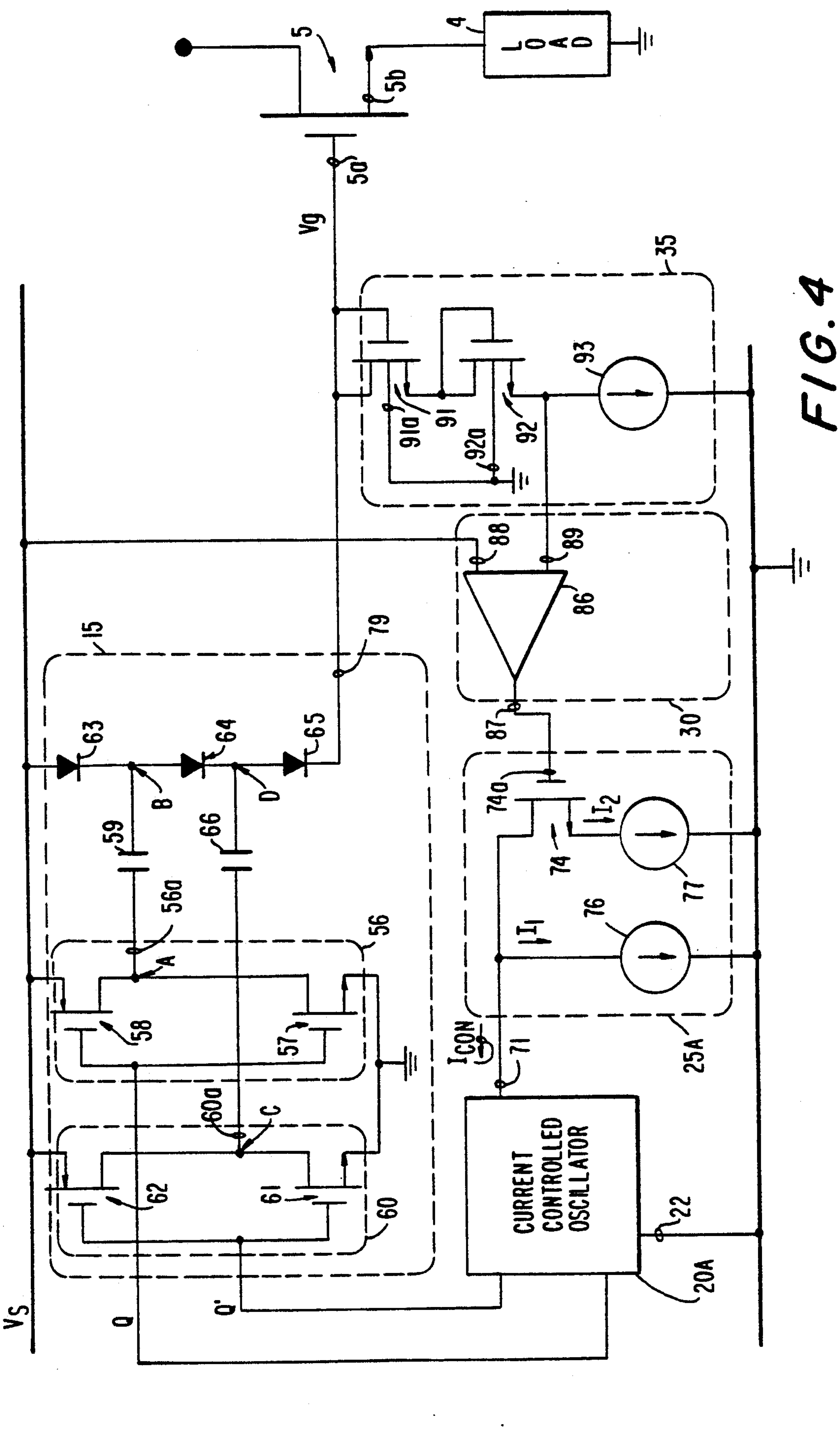
FIG. 4 is a more detailed circuit diagram of the circuit of FIG. 3.

FIG. 4 shows a more detailed circuit diagram of the circuit of FIG. 3. As shown in FIG. 4, inverters 56 and 60 of voltage multiplier circuit 15 are comprised of CMOS transistor pairs 57/58 and 61/62, respectively. Control current generator 25A includes current source 76 and current source 77 which provide two states of control current $I_{CON}$ to current-controlled oscillator 20A depending on the state of MOSFET 74. Mode switch 30 includes comparator 86, while gate voltage detector circuit 35 includes two diode-connected NMOS transistors 91 and 92 as well as current source 93.

Current-controlled oscillator 20A shown in FIG. 4 is driven by a control current generator 25A. The magnitude of the control current $I_{CON}$ delivered to control terminal 71 of oscillator 20A determines the frequency at which oscillator 20A oscillates. For the present embodiment, control current $I_{CON}$ will be either $I_1$, or $I_1+I_2$, depending upon whether MOSFET 74 is OFF or ON, respectively. Currents $I_1$ and $I_2$ are supplied by current supplies 76 and 77, respectively.

MOSFET 74, which determines whether current supply 77 contributes to control current $I_{CON}$, is in turn controlled by mode switch 30 which has an output terminal 87 connected to gate 74*a* of MOSFET 74. The output 87 of mode switch 30 is taken from comparator 86 which has one input terminal 88 connected to supply voltage $V_S$ and a second input terminal 89 connected to gate voltage detector circuit 35 which monitors the voltage on gate 5*a* of MOSFET 5. MOSFET 74 is turned OFF when the voltage at input terminal 89 exceeds the voltage at input terminal 88 of comparator 86.

For the present embodiment, gate voltage detector circuit 35 is comprised of two diode-connected NMOS transistors 91 and 92, as well as current source 93 which provides a small bias current to transistor diodes 91 and 92. It will be apparent to persons of ordinary skill in the art that circuit 35 should have high equivalent input impedance and demand little current (preferably less than approximately 100 nA in this embodiment) since this circuit takes charge away from drive terminal 79 which could otherwise be used to charge gate 5*a* to a higher charge-pumped voltage level.

Since high voltage (approximately 3 times $V_S$) will appear at gate 5*a* of MOSFET 5, transistor diodes 91 and 92 have their respective p-wells 91*a* and 92*a* connected to ground so as to ensure that source/drain-p well junctions are reverse-biased and severely body-effected. Transistor diodes 91 and 92 have voltage drops across them which, respectively, are approximately proportional to the square root of the supply voltage $V_S$ (since they are severely body-effected). Thus, the total voltage drop across the combination of transistor diodes 91 and 92 is approximately 2 times the square root of supply voltage $V_S$. Therefore, when the voltage on gate 5*a* of MOSFET 5 reaches approximately the supply voltage $V_S+2$ times the square root of the supply voltage $V_S$, mode switch 30 turns transistor 74 OFF. After transistor 74 is turned OFF, control current $I_{CON}$ switches from a value corresponding to $I_1+I_2$ to a value corresponding to $I_1$. This change in $I_{CON}$ decreases the frequency of oscillation of oscillator 20A, to conserve power, when gate 5*a* of MOSFET 5 reaches approximately the supply voltgae $V_S+2$ times the square root of the supply voltage $V_S$.

Although gate voltage detector circuit 35 is shown in FIG. 3 to be comprised of two diode-connected NMOS transistors, it will be apparent to persons of ordinary skill in the art that other circuits could be employed to monitor the gate voltage $V_g$ and provide an input to terminal 89 of comparator 86. For example, gate voltage detector circuit 35 could be comprised of a low-loss zener diode that has a breakdown voltage in a range that would allow MOSFET 74 to turn OFF when the gate voltage $V_g$ exceeds the frequency switching voltage $V_{FSW}$.

Figure 5A:
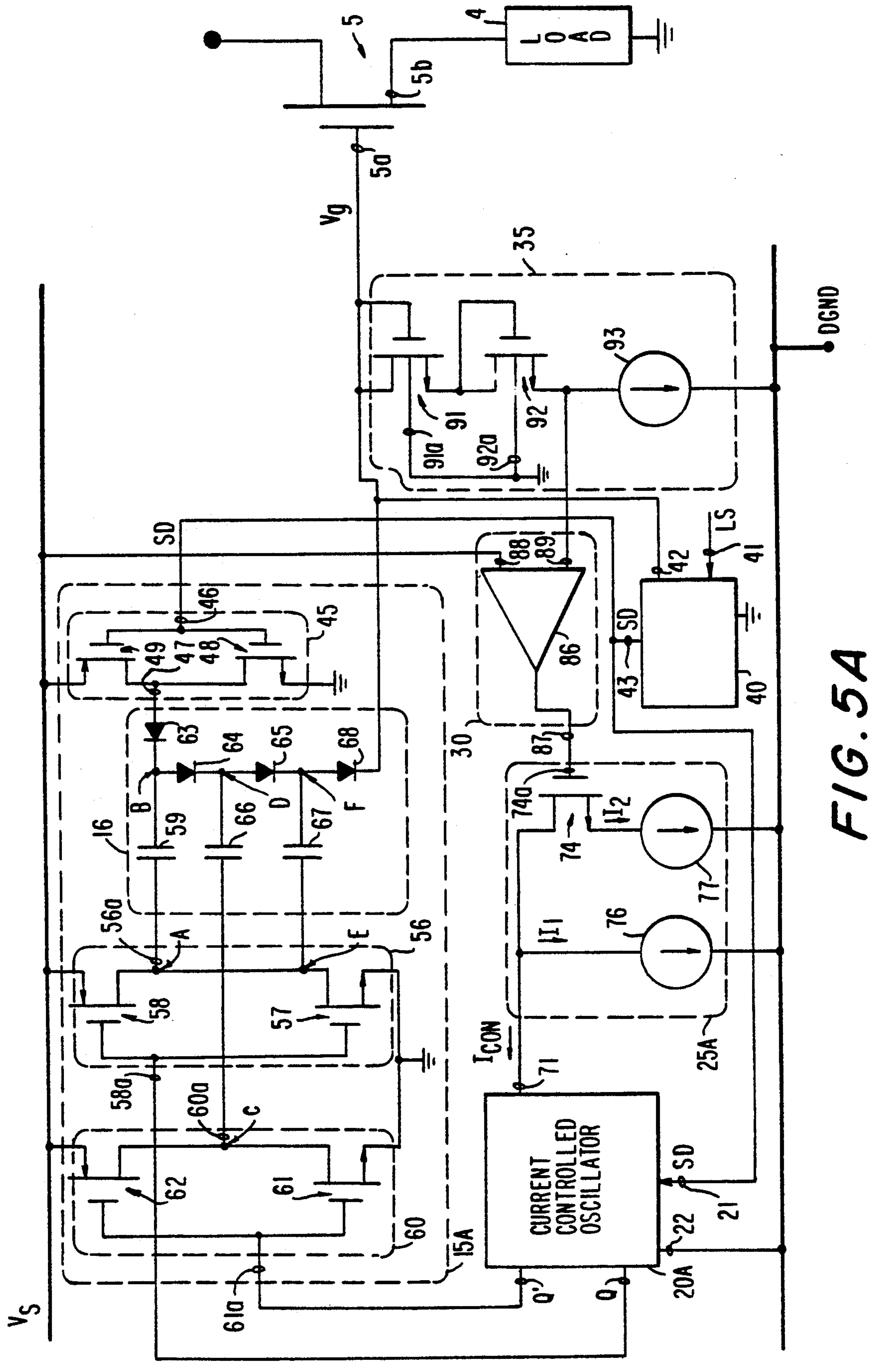
FIGS. 5A-5C are simplified circuit diagrams of an exemplary p-well CMOS integrated circuit implementation of the invention.
Figure 5B:
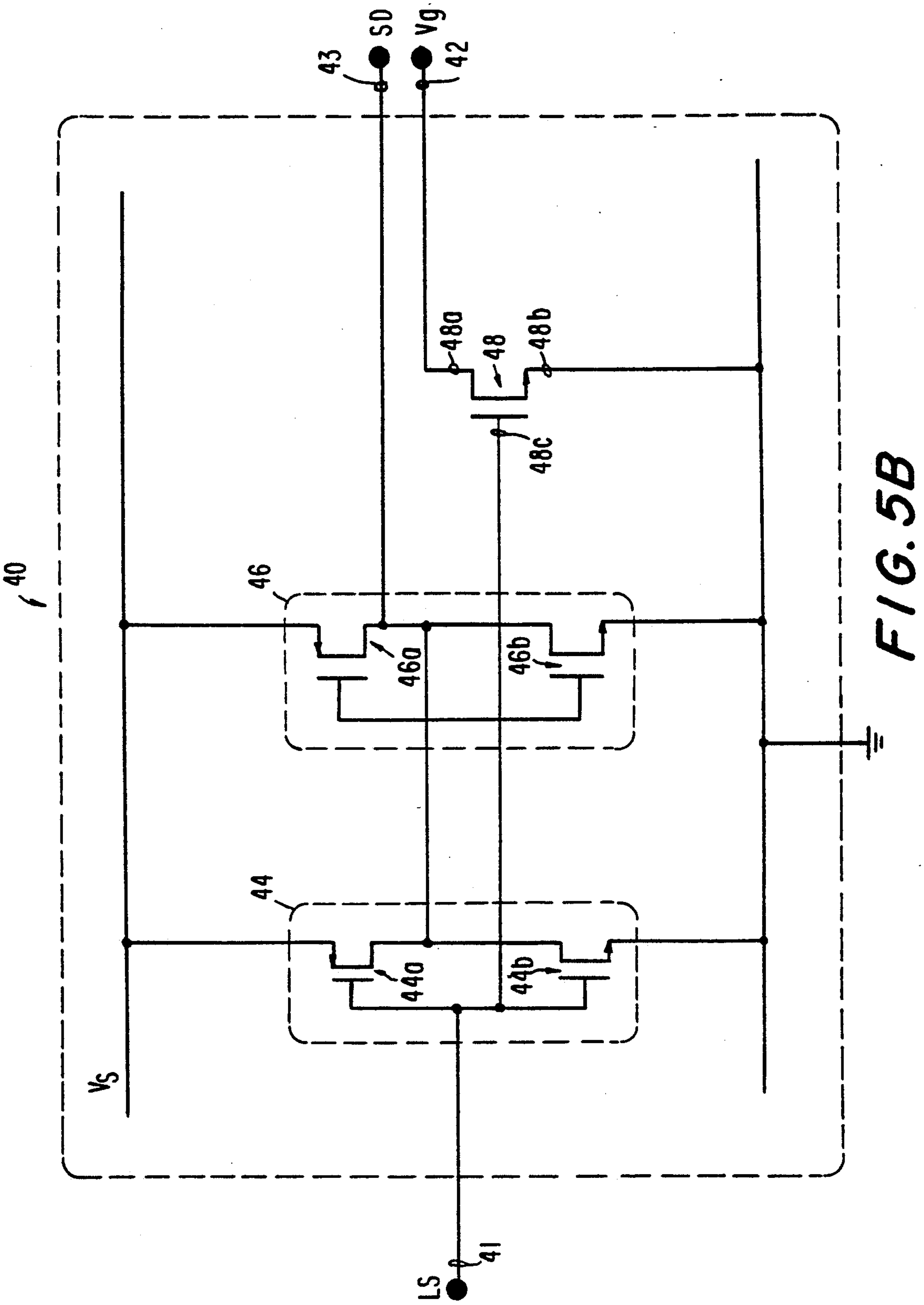
Figure 5C:
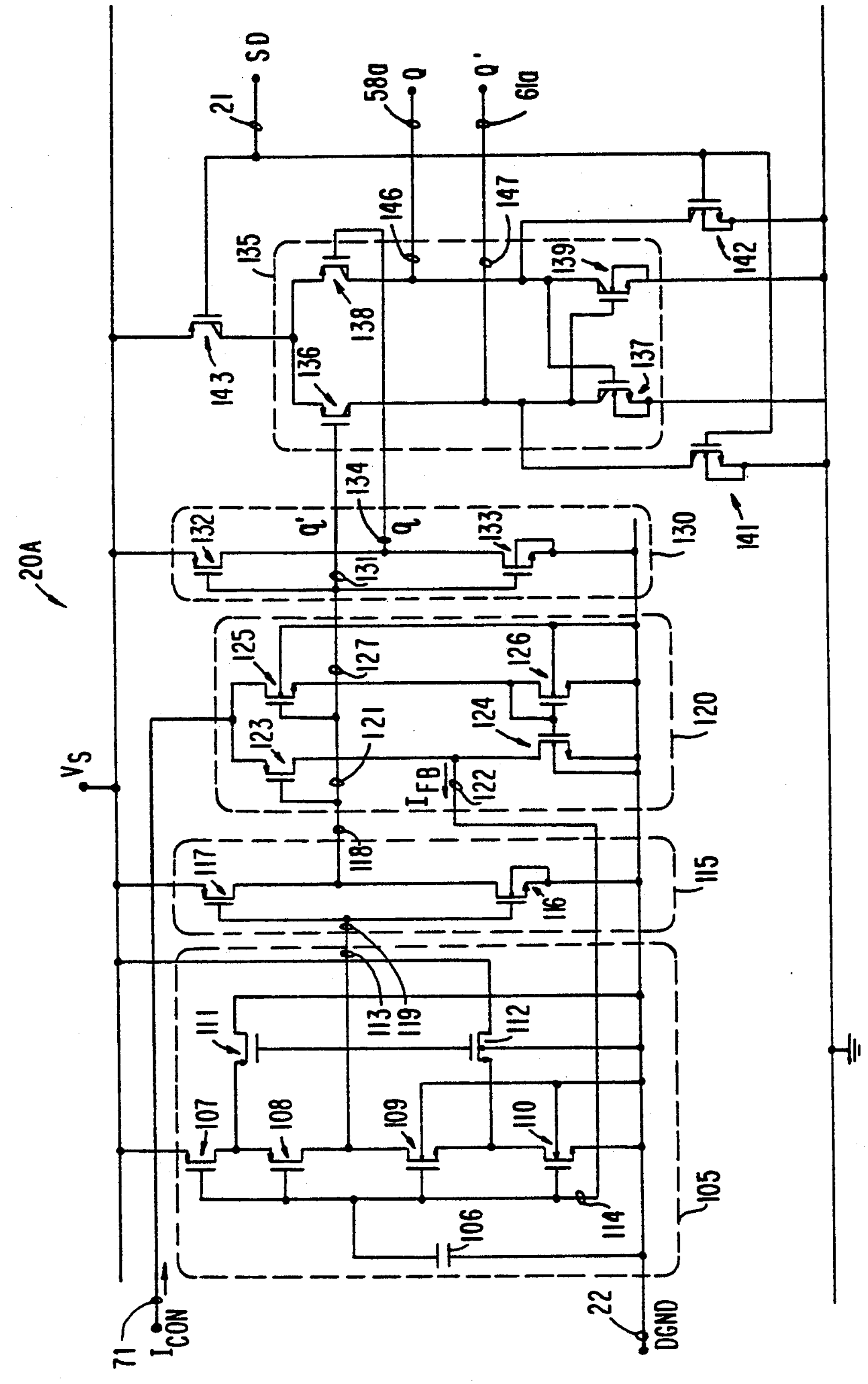

FIGS. 5A–5C show simplified circuit diagrams of an exemplary embodiment of a p-well CMOS integrated circuit constructed and operating in accordance with the principles of the present invention. The additional features of the circuit of FIGS. 5A-5C, not discussed above with respect to FIG. 4, are explained below.

The circuit of FIG. 5A includes voltage multiplier circuit 15A, which provides voltage quadrupling (ignoring diode drops) in contrast to voltage multiplier 15 of FIG. 4, which provides voltage tripling. Voltage multiplier circuit 15A includes circuit 16, which has an additional capacitor 67-diode 68 pair which is driven by the output of inverter 56. Thus, because the voltage at node E (the output of inverter 56) cycles between zero and $V_S$ and, as discussed above, the voltage at node D cycles between $2V_S$ and $3V_S$, the voltage at node F cycles between $3V_S$ and $4V_S$ (ignoring diode drops). As a result, the voltage $V_G$ at gate 5a of voltage multiplier circuit 15A reaches a boosted level of about $4V_S$.

Although voltage multiplier circuit 15A shows inverters 56 and 60 as being comprised of single CMOS transistor pairs, it will be apparent to persons of ordinary skill in the art that these inverters can be comprised of power inverters to provide better switching characteristics. In such a case, each of inverters 56 and 60 would include two cascaded CMOS inverters where Q or Q' is used, respectively, to drive the input of a first CMOS inverter which has its output connected to drive the input of a second larger CMOS inverter.

In the circuit of FIG. 5A, diodes 64, 65 and 68 are preferably fabricated in a conventional fashion from diode-connected NMOS transistors each having its gate and drain connected together to form an anode of the diode, its source connected to form a cathode of the diode, and its p-well connected to the drain of transistor 49. Such diodes, although having large turn-on voltages (approximately 2 volts), provide low-loss and are capable of operating at voltages in excess of the supply voltage $V_S$ (i.e., the charge pumped voltage Vcp). Diode 63 is fabricated using the parasitic vertical n-p-n (drain-p well-substrate) bipolar transistor action present in p-well NMOS transistor structures (i.e., the drain-p well-substrate junctions of diode-connected NMOS transistor 64). Such a diode provides low-loss in combination with low turn-on voltage (approximately 1 volt).

In addition, although not shown in FIG. 5A, individual zener diodes, with breakdown voltages in the range of 20-25 volts, are preferably coupled in conventional fashion in parallel across each charge pump capacitor 59, 66 and 67 to provide electrostatic protection. Current limiting resistors (e.g., approximately 5000 ohms) also may be coupled in series between inverters 56 and 60 and the charge pump capacitors to reduce current flow. For the embodiment of the present invention shown in FIG. 5A, charge pump capacitors 59, 66 and 67 preferably have a capacitance of approximately 18 picofarads.

Also shown in FIG. 5A is a digital ground, DGND. The circuit of FIG. 5A is powered by a supply rail voltage, $V_S$, typically ranging from 4.5 to 18 volts. Digital ground DGND is adapted to be coupled to a conventional voltage regulator (not shown) which provides a conventional regulated digital ground voltage for operating the p-well CMOS logic of the present embodiment. DGND is typically maintained at approximately 5 volts below $V_S$.

Circuit 40 of FIG. 5A is a gate discharge and shutdown circuit. Circuit 40 performs two functions when it is desired to turn MOSFET 5 OFF. First, circuit 40 grounds gate 5a. Second, circuit 40 generates a shut down signal (SD) which is used to shut down voltage multiplier circuit 15A and current controlled oscillator 20A to conserve power when MOSFET 5 is OFF. (Additionally, when MOSFET 5 is turned OFF, DGND can be connected to the supply rail voltage $V_S$ by other control circuitry (not shown) such as a conventional PMOS switch with its source connected to $V_S$ and its drain connected to DGND, so as to further ensure that the CMOS logic circuitry of the present embodiment does not consume power in the OFF state.)

The circuitry of gate discharge and shutdown circuit 40 is shown in FIG. 5B. Circuit 40 includes NMOS switch 48 which has its drain 48a connected to gate 5a through terminal 42 and its source 48b connected to ground. Gate 48c of NMOS switch 48 is controlled by a logic signal LS (provided via terminal 41 in FIGS. 5A and 5B) that turns NMOS switch 48 0N when it is desired to turn MOSFET 5 OFF. Logic signal LS can be generated by substantially any conventional control circuitry. It is desirable that MOSFET 5 is switched by NMOS switch 48 at a rate that does not produce excessive RFI and EMI emissions in normal operation. If desired, an additional larger NMOS switch (not shown), with corresponding conventional logic circuitry, could be connected in parallel with NMOS switch 48 to ground gate 5a under different operating conditions. For example, to provide an automatic shutdown when the output circuit of MOSFET 5 is shorted or overloaded the additional NMOS switch could be driven by a logic signal to turn MOSFET 5 off more quickly than switch 48.

Gate discharge and shutdown circuit 40 also generates a shut down signal SD (terminal 43 in FIGS. 5A and 5C) which goes HIGH when LS goes HIGH. Shut down signal SD is taken from the output of CMOS inverter 46, comprised of transistors 46a and 46b, which is driven by a second CMOS inverter 44, comprised of transistors 44a and 44b. CMOS inverter 44 is driven by logic signal LS through terminal 41. If desired, an additional CMOS inverter (not shown), with corresponding conventional logic circuitry, could be OR'd together with CMOS inverter 44 to generate a HIGH shutdown signal SD to provide automatic shutdown when the output circuit of MOSFET 5 is shorted or overloaded.

Shutdown signal SD is coupled to circuit 45 of voltage multiplier circuit 15A, and also to current controlled oscillator 20A. Circuit 45 is a CMOS switch including transistors 48 and 49. In response to shutdown signal SD, CMOS switch 45 disconnects charge pump diode 63 from voltage supply $V_S$ and connects it to ground to ensure that, when MOSFET 5 is OFF, power dissipation is minimal.

Shutdown signal SD is also used in a similar fashion by current controlled oscillator 20A, shown in more detail in FIG. 5C and described below.

As shown in FIG. 5C, oscillator 20A of FIG. 5A includes Schmitt trigger 105, inverters 115 and 130, current switch 120 and level shifter 135.

The oscillation frequency of Schmitt trigger 105 is set by the combination of the magnitude of control current $I_{CON}$ supplied through terminal 71 and the capacitance of capacitor 106. Schmitt trigger 105 includes transistors 107-112 and accepts a feedback current $I_{FB}$ from current switch 120. The feedback current is used to charge and discharge capacitor 106 at a rate which determines the oscillation frequency of oscillator 20A. Current switch 120, which includes transistors 123-126, is driven via terminal 121 by output terminal 118 of inverter 115. Current switch 120 either (1) directs control current $I_{CON}$ through transistor 123 to terminal 122 which, in turn, charges capacitor 106 when the Schmitt trigger output terminal 113 is HIGH (i.e., $I_{FB}=I_{CON}$), or (2) directs control current $I_{CON}$ through transistors 125 and 126 to DGND so as to allow transistor 124 to turn on and thus connect feedback terminal 122 to DGND which, in turn, discharges capacitor 106 to DGND when the Schmitt trigger output terminal 113 is LOW. Thus, current switch 120 controls the charging and discharging of capacitor 106 which, in turn, controls the switching of the state of Schmitt trigger 105. As a result, the frequency of the switching of Schmitt trigger 105 is controlled by the magnitude of $I_{CON}$ and the capacitance of capacitor 106.

The combination of Schmitt trigger 105, inverter 115 and current switch 120 generate an oscillating waveform q' at terminal 127 of current switch 120 whose frequency is current controlled. In turn, oscillating waveform q' is used to drive inverter 130, comprised of transistors 132 and 133, which produces waveform q (terminal 131) that oscillates 180 degrees out of phase with q'. Waveforms q and q' have a voltage swing from DGND to $V_S$ (i.e., approximately 5 volts). This voltage swing is converted to a corresponding larger voltage swing, from ground to $V_S$ (approximately 4.5 to 18 volts), by level shifter 135 which produces waveforms Q and Q' at terminals 146 and 147, respectively. Level shifter 135 is comprised of transistors 136–139. When shut down signal SD goes HIGH (terminal 21 in FIG. 5C) Q and Q' are disconnected from $V_S$ and connected to ground. These shut down functions are provided by transistors 141, 142 and 143 to ensure that, when MOSFET 5 is OFF, power dissipation is minimal.

For the present embodiment, after transistor 74 of control current generator 25A is turned OFF, control current $I_{CON}$ switches from $I_1+I_2$ to $I_1$. Preferably, $I_2$ is set to a value approximately 3 times the value of $I_1$ so that the control current ratio is approximately 4 to 1. Thus, the frequency of current-controlled oscillator 20A is decreased by a factor of 4 when the gate voltage on gate 5*a* reaches approximately the supply voltage $V_S+2$ times the square root of the supply voltage $V_S$ ($V_{FSW}$). The frequency of current-controlled oscillator 20A is preferably decreased from approximately 500 kHz to approximately 125 kHz as control current $I_{CON}$ is decreased from approximately 8–10 microamps to 2–2.5 microamps as the gate voltage $V_G$ exceeds $V_{FSW}$. For the present embodiment, capacitor 106 has a capacitance of approximately 5 picofarads.

It will be apparent to persons of ordinary skill in the art that it is desirable to fabricate the gate charge pump circuit shown in FIGS. 5A–5C using low-leakage, compact capacitor structures in conjunction with efficient CMOS inverters. Such low-leakage circuits, although not required for basic operation of the gate charge pump circuit, allows higher efficiency to be achieved. These circuits can be similar to those used in other high-performance CMOS circuits (e.g., chopper-stabilized amplifiers and micropower hex translator circuits).

Thus it is seen that a gate charge pump circuit has been disclosed for driving the gate of a MOSFET switch under micropower conditions. Persons skilled in the art will appreciate that the present invention can be practiced by other than the described embodiments, which are presented for purposes of illustration and not of limitation, and the present invention is limited only by the claims which follow.

What is claimed is:

1. A circuit for charging the gate of a field-effect transistor to a boosted voltage in excess of a supply voltage, the circuit comprising:

a capacitive voltage multiplier having an input for receiving an oscillating signal and an output for producing the boosted voltage, the multiplier operating to cause the boosted voltage to increase beyond the supply voltage at a rate determined at least in part by the frequency of the oscillating signal;

an oscillator coupled to the multiplier to produce the oscillating signal at a first frequency or a second lower frequency selected in response to the receipt of a control signal, the first and second frequencies causing the boosted voltage to increase beyond the supply voltage at, respectively, first and second rates; and means coupled to sense the voltage at the gate of the field-effect transistor and to responsively generate the control signal such that the oscillator produces the oscillating signal at the first frequency when the gate voltage is less than a frequency switching voltage, and the oscillator produces the oscillating signal at the second frequency when the gate voltage exceeds the frequency switching voltage, whereby the power consumption of the circuit is reduced when the gate voltage exceeds the frequency switching voltage.

2. The circuit of claim 1 wherein:

the oscillator comprises a current-controlled oscillator and the control signal is a current; and the voltage sensing means includes a voltage comparator.

3. A method for charging the gate of a field-effect transistor to a voltage boosted in excess of a supply voltage, the method comprising the steps of:

producing a boosted voltage in response to a signal oscillating at a frequency, the boosted voltage increasing beyond the supply voltage at a rate determined at least in part by the frequency of oscillation of the oscillating signal;

generating the oscillating signal at a first frequency or a second lower frequency selected in response to a control signal, the first and second frequencies causing the boosted voltage to increase beyond the supply voltage at, respectively, first and second rates; and sensing the gate voltage of the field-effect transistor to generate the control signal to cause the oscillator to produce the oscillating signal at the first frequency when the gate voltage is less than a frequency switching voltage, and the oscillating signal at the second frequency when the gate voltage exceeds the frequency switching voltage, whereby the power consumption is reduced when the gate voltage exceeds the frequency switching voltage.

4. The method of claim 3 wherein:

the control signal is a current signal; and the step of voltage sensing further comprises comparing the gate voltage to a predetermined voltage.

5. A circuit for charging the gate of a field-effect transistor to a voltage boosted in excess of a supply voltage, the circuit comprising:

voltage multiplier means for producing the boosted voltage in response to the receipt of an oscillating signal, said means operating such that the boosted voltage increases beyond the supply voltage at a rate determined at least in part by the oscillation frequency of the oscillating signal;

oscillating means for producing the oscillating signal at a first frequency or a second lower frequency selected by a control signal, said first and second frequencies chosen to cause the boosted voltage produced by the voltage multiplier to increase beyond the supply voltage at, respectively, first and second rates; and means coupled to sense the voltage at the gate of the field-effect transistor for responsively generating the control signal to cause the oscillating means to produce the first frequency when the gate voltage is less than a frequency switching voltage and the second frequency when the gate voltage exceeds the frequency switching voltage, whereby the power consumption of the circuit is reduced when the gate voltage exceeds the frequency switching voltage.

6. The circuit of claim 5, wherein:

the oscillating means comprises a current-controlled oscillator wherein the control signal is a current signal; and the voltage sensing means comprises a voltage comparator.

7. An improvement in a method for operating a charge-pump circuit for boosting a voltage applied to a gate of a field-effect transistor beyond a supply voltage, the circuit including a capacitive multiplier for producing the boosted voltage in response to an oscillating signal coupled to multiplier, the improvement in the method comprising the steps of:

initially generating the oscillating signal at a first frequency to cause the gate voltage to be boosted beyond the supply voltage at a first rate; and generating the oscillating signal at a second frequency when the gate voltage of the transistor has been initially sufficiently boosted, the second frequency being lower than the first frequency to reduce the power consumption of the circuit and to cause the gate voltage to be boosted beyond the supply voltage at a second rate sufficient to at least maintain the gate voltage in excess of the supply voltage.

8. The improved method of claim 7, wherein the gate voltage has been sufficiently boosted when that voltage reaches a value which causes the transistor to be driven into enhancement under its expected operating conditions.

9. An improvement in a charge-pump circuit for boosting a voltage applied to a gate of a field-effect transistor beyond a supply voltage, the circuit including a capacitive multiplier for producing the boosted voltage in response to an oscillating signal coupled to multiplier, the rate of boost being determined at least in part by the frequency of the oscillating signal, the improvement in the circuit comprising:

a variable frequency oscillator for producing the oscillating signal at a first frequency to cause the gate voltage to be boosted at a first rate;

means for detecting when the gate voltage has been initially sufficiently boosted; and means responsive to said detecting means for generating the control signal when the gate voltage has been initially sufficiently boosted to change the frequency to a second frequency lower than the first frequency, said second frequency chosen to reduce the power consumption of the circuit and to boost the gate voltage at a second rate at least sufficient to maintain the boosted voltage beyond the supply voltage.

10. A circuit for charging a gate of a transistor to a boosted voltage in excess of a supply voltage, the transistor operating in a plurality of operational states each corresponding to a particular set of current-voltage characteristics of the transistor, the circuit comprising:

an oscillator for generating a signal oscillating at at least first and second frequencies chosen in response to a control signal received by said oscillator;

a charge-pump voltage multiplier coupled to the supply voltage, said multiplier having an input coupled for receiving the oscillating signal and an output coupled to produce at the gate of the transistor the boosted voltage, said multiplier operating to increase the boosted voltage beyond the supply voltage at a rate determined at least in part by the frequency of the oscillating signal; and means for detecting the operational state of the transistor and for responsively generating the control signal to cause the oscillator to generate the oscillating signal at a first frequency when the transistor is in a first operating state to boost the gate voltage beyond the supply voltage at a first rate, and to generate the oscillating signal at a second frequency lower than the first when the transistor is in a second operating state to boost the voltage beyond the supply voltage at a second rate, whereby the power consumed by the circuit is reduced when the transistor is in the second operating state.

11. The circuit of claim 10 wherein:

the oscillator comprises a current-controlled oscillator wherein the control signal is a current signal; and the operational state detecting means comprises a voltage comparator.

12. The circuit of claim 11 wherein the operational state detecting means monitors the voltage on the gate of the transistor, and wherein the second operating state of the transistor comprises a predetermined range of gate voltages in excess of a minimum predetermined voltage value.

13. The circuit of claim 12 wherein:

the charge-pump voltage multiplier comprises two charge-pump capacitors and two inverters which are driven out of phase with each other by the oscillating signal, wherein the outputs of each invertor are each coupled to a different charge-pump capacitor.

14. The circuit of claim 13 wherein the control current signal takes on a first current value when the gate voltage is below the minimum predetermined gate voltage value and a second current value when the gate voltage exceeds the minimum predetermined gate voltage value.

15. The circuit of claim 14 wherein the operational state detecting means includes at least two diode-connected NMOS transistors with their corresponding p-wells connected to ground and wherein the transistors are coupled in series with a current source for providing a small bias current to the transistor diodes.

16. The circuit of claim 10 wherein the operational state detecting means monitors the current through the transistor and wherein the second operating state of the transistor comprises a predetermined range of transistor currents in excess of a minimum predetermined current value.

* * * * *

UNITED STATES PATENT AND TRADEMARK OFFICE

CERTIFICATE OF CORRECTION

PATENT NO. : 5,258,662
DATED : November 2, 1993
INVENTOR(S) : Timothy J. Skovmand It is certified that error appears in the above-indentified patent and that said Letters Patent is hereby corrected as shown below:

IN THE DRAWINGS

Correction To FIG. 5B

The output (common source/drain) of inverter 44 should be shown as being connected to the input (common gate) of inverter 46 rather than the output of inverter 46.

| Column | Line | Correction |
|---|---|---|
| 3 | 39 | "detector 10" should be -- detector 35 --. |
| 4 | 42 | "swithcing" should be -- switching --. |
| 5 | 26 | After "FIG. 1", insert a period -- . --. |
| 5 | 42 | "invertor" should be -- inverter --. |
| 5 | 43 | "invertor" should be -- inverter --. |
| 5 | 44 | "invertor" should be -- inverter --. |
| 8 | 15 | "ON" should be -- ON --. |
| 12 | 49 | "invertor" should be -- inverter --. |

Signed and Sealed this

Twenty-seventh Day of December, 1994

Attest:

BRUCE LEHMAN

Attesting Officer

Commissioner of Patents and Trademarks